(12) United States Patent
Krassnitzer et al.

(10) Patent No.: US 10,418,230 B2
(45) Date of Patent: Sep. 17, 2019

(54) METHOD AND APPARATUS FOR MANUFACTURING CLEANED SUBSTRATES OR CLEAN SUBSTRATES WHICH ARE FURTHER PROCESSED

(75) Inventors: Siegfried Krassnitzer, Feldkirch (AT); Oliver Cstoehl, Balzers (LI); Daniel Lewis, Grabs (CH)

(73) Assignee: OERLIKON TRADING AG, TRUEBBACH, Truebbach (CH)

( * ) Notice: Subject to any disclaimer, the term of this patent is extended or adjusted under 35 U.S.C. 154(b) by 1915 days.

(21) Appl. No.: 11/870,119

(22) Filed: Oct. 10, 2007

(65) Prior Publication Data

US 2008/0099039 A1    May 1, 2008

(30) Foreign Application Priority Data

Oct. 27, 2006    (WO) .................. PCT/EP2006/067869

(51) Int. Cl.
*H01J 37/34*    (2006.01)
*H01J 37/32*    (2006.01)
(Continued)

(52) U.S. Cl.
CPC ........ *H01J 37/3438* (2013.01); *B08B 7/0035* (2013.01); *H01J 37/32568* (2013.01); *H01J 37/32623* (2013.01); *H01J 37/32633* (2013.01); *H01J 37/34* (2013.01); *H01J 37/3447* (2013.01); *H01L 21/67028* (2013.01); *H01L 21/67069* (2013.01); *H01J 2237/335* (2013.01)

(58) Field of Classification Search
CPC ............. H01J 37/3447; H01J 2237/335; H01J 37/32431; H01J 37/32; H01J 37/34; H01J 37/32568; H01J 37/32623; H01J 37/3438; H01L 21/67028; H01L 21/67069; C23G 5/00; B08B 7/0035
USPC ............... 204/192.1, 192.38, 298.01, 298.41
See application file for complete search history.

(56) References Cited

U.S. PATENT DOCUMENTS 3,625,848 A * 12/1971 Snaper ...................... 204/192.38
4,620,913 A * 11/1986 Bergman ................... 204/192.1
(Continued)

FOREIGN PATENT DOCUMENTS

DE    4228499    10/1993
DE    4306611 A1 * 9/1994 ........ H01J 37/32568
(Continued)

OTHER PUBLICATIONS

Machine Translation DE4306611.*
(Continued)

*Primary Examiner* — Michael A Band
(74) *Attorney, Agent, or Firm* — Notaro, Michalos & Zaccaria P.C.

(57) ABSTRACT

Plasma etch-cleaning of substrates is performed by means of a plasma discharge arrangement comprising an electron source cathode (5) and an anode arrangement (7). The anode arrangement (7) comprises on one hand an anode electrode (9) and on the other hand and electrically isolated therefrom a confinement (11). The confinement (11) has an opening (13) directed towards an area (S) of a substrate (21) to be cleaned. The electron source cathode (5) and the anode electrode (9) are electrically supplied by a supply circuit with a supply source (19). The circuit is operated electrically floating.

18 Claims, 7 Drawing Sheets

Figure 1:
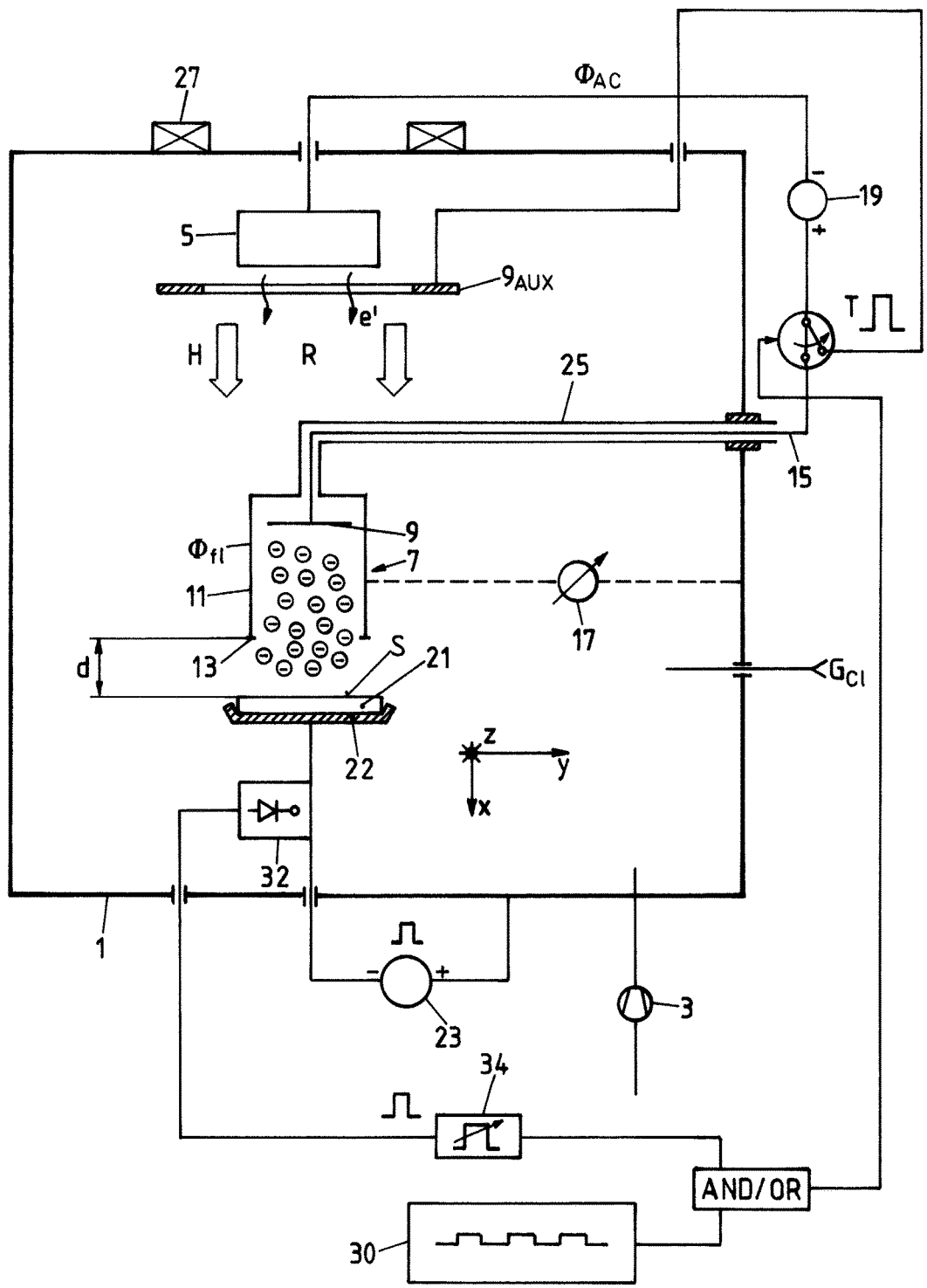

(51) Int. Cl.
*H01L 21/67* (2006.01)
*B08B 7/00* (2006.01)

(56) References Cited

U.S. PATENT DOCUMENTS

| | | | | |
|---|---|---|---|---|
| 5,302,271 | A | * | 4/1994 | Chan et al. ............... 204/298.41 |
| 5,294,322 | A | | 5/1994 | Vetter et al. |
| 5,503,725 | A | | 4/1996 | Sablev et al. |
| 5,754,581 | A | | 5/1998 | McLellan |
| 6,051,113 | A | * | 4/2000 | Moslehi ................ C23C 14/568 118/719 |
| 6,086,710 | A | | 7/2000 | Miyashita et al. |
| 6,103,074 | A | * | 8/2000 | Khominich .............. 204/192.38 |
| 6,285,025 | B1 | * | 9/2001 | Metel ........................ H05H 3/02 250/251 |
| 6,391,164 | B1 | * | 5/2002 | Beilis et al. ............. 204/192.38 |
| 6,444,103 | B1 | * | 9/2002 | Moslehi et al. .......... 204/298.11 |
| 6,663,755 | B2 | * | 12/2003 | Gorokhovsky ....... C23C 14/022 204/192.38 |
| 2004/0060813 | A1 | * | 4/2004 | Chistyakov .............. 204/192.12 |
| 2005/0061444 | A1 | | 3/2005 | Noda et al. |

FOREIGN PATENT DOCUMENTS

| | | |
|---|---|---|
| GB | 521920 | 6/1940 |
| WO | WO 2004003968 | 1/2004 |

OTHER PUBLICATIONS

Translation of Henrich et al, DE 4306611 A1.*
Machine Translation DE4228499.*
S.S. Mackeown, The Cathode Drop in an Electric Arc, Physical Review, Aug. 1929, p. 611-614, vol. 34.

* cited by examiner

METHOD AND APPARATUS FOR MANUFACTURING CLEANED SUBSTRATES OR CLEAN SUBSTRATES WHICH ARE FURTHER PROCESSED

The present invention refers under a first aspect to manufacturing at least one cleaned substrate, thereby especially cleaned cutting tool bodies which cleaned substrates are possibly additionally processed e.g. by heating and/or coating, before and/or after being cleaned. The cleaning process which is used for manufacturing such cleaned substrates is, generically spoken, plasma etching, being non-reactive or being reactive. It is, under the first aspect of the present invention, an object to provide increased etching-plasma density adjacent to a surface area of a substrate to be cleaned and to achieve improved uniform cleaning also within embossments and salient parts at the addressed surface area, thereby especially at cutting edges of tool body substrates.

This object according to the first aspect of the present invention is reached by a method for manufacturing at least one cleaned substrate or a substrate resulting from additional processing of such cleaned substrate, which method comprises:

Establishing in a vacuum chamber having a reaction space and containing a gas to be ionized at least one plasma discharge between at least one electron source cathode and at least one anode arrangement having at least one anode electrode;

increasing electron density and thereby ion density adjacent the at least one anode arrangement by means of a confinement having an opening open towards the reaction space and comprising the at least one anode electrode;

providing the anode electrode within the confinement and operating the confinement on an electric potential which is different from an electric potential applied to the anode electrode, thereby concentrating increased ion density in the confinement and adjacent the opening;

positioning the substrate on a negative electric potential, at least averaged over time, and with respect to the electric potential of the anode electrode;

positioning at least a surface area to be cleaned of the substrate exposed to the area of increased ion density and adjacent the opening, thereby substantially closer to the opening than to the electron source cathode, for a predetermined cleaning time.

According to the DE 42 28 499 plasma cleaning of substrates is realized by establishing a plasma discharge between a hollow cathode and a substantially flat anode facing the hollow cathode and along a discharge axis. The substrates are positioned within the vacuum chamber distant from and along the discharge axis.

According to a further reference generically directed on plasma cleaning, in the DE 41 25 365 which accords with U.S. Pat. No. 5,294,322, there is established between an evaporation target and the wall of a vacuum chamber as an anode and by a first electric supply a first plasma discharge. For cleaning purposes a shutter is positioned between the evaporation target and the substrates. A second anode electrode is U-shaped and, for cleaning purposes, operated by a second additional electric supply on anodic potential with respect to the wall of the vacuum chamber. Via a third electric supply the substrates are operated on cathodic potential with respect to the addressed wall.

Attention is further drawn to the U.S. Pat. No. 5,503,725.

According to the present invention, in one embodiment the addressed plasma discharge is generated as a low voltage discharge with an anode electrode to electron source cathode voltage $U_{AUX}$ for which there is valid

20 V≤$U_{AC}$≤100 V thereby in a further embodiment,

35 V≤$U_{AC}$≤70 V.

DEFINITION

Whenever throughout the present disclosure and claims we address voltage, current or electric potential values we refer to such values being "Root Mean Square" values (RMS). For the definition of such Root Mean Square values we refer e.g. to Wikipedia http://en.wikipedia.org/wiki/ROOT_MEAN_SQUARE In a further embodiment the anode electrode and the electron source cathode are operated by an electric supply circuit which is operated on floating electric potentials.

Thereby, only one electric supply is used and the electron source cathode "sees" just one anode electrode at a defined potential difference, which is the addressed anode electrode within the confinement.

In spite of the fact that by an additional electric supply the addressed confinement might be driven on a predetermined, possibly adjustable electric potential which is different from the electric potential of the anode electrode, in one embodiment the addressed confinement is operated on floating electric potential.

Thereby, the addressed confinement is of metal or has a dielectric material body, at least a part of the surface thereof being of metal. Possibly it might even be of a dielectric material.

In one embodiment the inner space of the addressed confinement is selected to be substantially U-shaped at least in one cross-sectional plane. The anode electrode is provided spaced from and along the bottom of the U-shaped inner space, still considered in the addressed cross-sectional plane.

Further, in an embodiment the addressed U-shaped inner space forms a channel as considered transverse to the addressed cross-sectional plane.

In a further embodiment the anode electrode is electrically fed with respect to the electron source cathode with DC and superimposed pulses. Thereby, it becomes possible on one hand to generate a high plasma density within and adjacent to the addressed confinement and, on the other hand to controllably limit heating up of the confinement and of the anode electrode.

In a further embodiment at least one of DC value, amplitude of pulses with respect to the DC value, pulse repetition frequency, pulse width or duty cycle, pulse shape are adjustable. Thereby, in one embodiment the addressed pulse repetition frequency is selected to be 0.2 Hz≤f≤200 KHz.

Still in a further embodiment of the method according to the present invention, wherein the inner space of the confinement is selected to be substantially U-shaped at least in the one cross-sectional plane and wherein the anode electrode is provided spaced from and along the bottom of the U-shaped inner space, still considered in the addressed cross-sectional plane, the anode electrode has an extent $w_{AN}$ and the bottom of the inner space of the confinement has an extent of $w_{CO}$ and these values are selected so that there is valid $w_{AN} < w_{CO} \leq w_{AN} + 2DSD$.

DSD is the Dark Space Distance at the conditions the method is operated in the vacuum chamber.

Thereby, the dark space distance at such operating conditions is about 0.5 mm to 10 mm, at a total pressure in the vacuum chamber of 0.1 Pa to 10 Pa. The DSP is approx. 1 mm to 10 mm for a total pressure of 0.1 Pa to 3 Pa.

In front of the surfaces of two electrodes, by which a plasma discharge is generated, there forms an area which is called, as known to the skilled artisan, "electrode dark space". The extent of this electrode dark space, substantially perpendicular to the electrode surface, is the dark space distance. It is across this space that substantially the electrode fall of potential is present, namely between the plasma potential and the electrode surface potential. Thus, it is substantially across this space that charged particles are accelerated by the electric field which results from the electrode fall of potential across the electrode dark space.

In a further embodiment the extent L of the legs of the U-shaped inner space of the confinement are selected according to:

$0.5w_{AN} \leq L \leq 1.5w_{AN}$.

Still in a further embodiment the surface area of the substrate to be cleaned is placed distant from a plane defined by the opening of the confinement by a distance d and there is selected:

2 cm≤d≤10 cm.

In a further embodiment of the method according to the present invention the anode electrode is fed with respect to the electron source cathode so as to result in a current density per unit of anode surface of at least 0.5 A/cm². Thereby, the upper limit for such current density is primarily limited by the efficiency of heat-up limiting measures which are installed in the anode arrangement.

In a further embodiment there is established by the addressed anode electrode to electron source cathode electric supply an anode fall of potential of 50 V to 100 V (both limits included). Thereby, the electrons are highly accelerated across the anode dark space towards the anode electrode, leading to a high ionization rate of gas molecules resident in that anode dark space.

In one embodiment the at least one electron source cathode is selected to be substantially exclusively producing electrons. Such a source may e.g. be a hot filament source or a hollow cathode source. Because it may not be excluded that by positive ion impact such cathode will also emit material particles, such source is specified as emitting "substantially" exclusively electrons.

In a further embodiment the at least one electron source cathode is selected to be a cathode emitting electrons and source material. In this case coating of the substrates is prevented by means of a controllably movable shutter. Thereby, such electron source cathode may e.g. be formed by a sputtering target, thereby a non-magnetron or a magnetron sputtering target or by an arc evaporation target. Thereby, the respective targets are operated, for cleaning operation according to the present invention, exclusively with the addressed anode electrode in the confinement.

In a further embodiment the substrate is operated on a DC, a DC+AC or an AC bias potential, thereby preferably on a DC potential with superimposed pulses.

In a further embodiment of the method according to the present invention, the substrates are additionally treated by at least one of the following process steps:

By metal ion etch cleaning in that there is selected as an electron source cathode a cathode which emits electrons and source metal and wherein flow of metal particles from the addressed cathode towards the addressed anode electrode is only limited but not prevented;

by heating, in that the anode electrode as addressed is disabled and the substrate is operated as anode electrode with respect to the electron source cathode;

by coating.

Thus, and with an eye on the coating step, whenever the electron source cathode is e.g. formed by the target of a sputtering source or of an arc evaporation source, during cleaning operation the anode electrode with the confinement is operated as the anode with respect to the addressed target cathode, whereas during the coating step the anode electrode with the confinement is disabled and the sputtering source or arc evaporation source specific anode, as e.g. the wall of the vacuum chamber, is enabled with respect to the sputtering cathode or, respectively, the arc evaporation cathode.

In fact the coating mode may be performed in different techniques:

a) The electron source cathode emits material and the anode electrode is disabled. Instead thereof there is enabled an anode which is specific to the material source comprising the electron source cathode.

b) The electron source cathode emits material, the anode electrode is kept enabled. Such a coating process is similar to ion plating.

c) The cathode emits substantially exclusively electrons, the anode electrode is enabled. There is inlet a coating gas as e.g. a carbon containing gas as e.g. methane or acetylene or a mixture thereof, which gas is broken open adjacent to the anode electrode so that a coating material, e.g. diamond-like carbon (DLC), is deposited. Such technique principally accords with plasma enhanced chemical vapour deposition (PECVD).

d) The electron source cathode emits electrons and material. The anode electrode is enabled. There is inlet a coating gas or reactive gas to the vacuum chamber.

e) The electron source cathode and the addressed anode electrode are both disabled. A separate coating material source is enabled.

In a further embodiment there is provided an auxiliary anode electrode in the vacuum chamber. Arcing, which means "disturbing" arcing, is prevented to occur or is prevented to develop in that the operation of the anode electrode which is active during substrate processing, be it cleaning, metal ion etching, heating or coating, is disabled during a first time span and is replaced by enabling operation of the auxiliary anode electrode.

Thereby, the first time span during which the auxiliary anode replaces operation of the processing anode is selected shorter than second time spans just before and just after the addressed first time span and during which second time spans substrate processing is performed.

In a further embodiment, departing from the just addressed embodiment with auxiliary cathode operation, the anode electrode which is active during substrate processing is the anode electrode of the anode arrangement, thus cooperating with the addressed confinement and the auxiliary anode electrode is positioned substantially closer to the electron source cathode than to the anode arrangement.

Still in a further embodiment the addressed switching over from the substrate processing anode electrode to the auxiliary anode during the addressed first time span is controlled in at least one of the following modes:

In the prevention mode where switch-over is timer-controlled regularly, e.g. periodically during processing time;

in the limiting mode where arcing is not prevented, but is rapidly detected by arc detection and further development of arcing is disabled by switching over from the processing anode electrode to the auxiliary anode once there is detected arcing to start.

With an eye on the just addressed prevention of processing damage to occur due to undesired arcing and considered under a more generic aspect, one electrode of a pair of electrodes participating in substrate plasma processing is disabled during a relatively short first time span and its operation is replaced by enabling operation of an auxiliary electrode. This generic approach for arc damage prevention is considered under a second aspect of the present invention as inventive per se and comprises a method for preventing processing damage to occur by undesired arcing when vacuum plasma discharge processing at least one substrate, whereby a plasma is generated under participation of at least two electrodes, which method comprises disabling operation of one of the at least two electrodes and, instead, enabling operation of an auxiliary electrode during a first time span which is significantly shorter than second time spans just before and just after the first time span.

With an eye on all the embodiments of the inventive method according to the first aspect of the invention as described above it must be stated that all these embodiments may be combined by two, three or more, unless specific embodiments are in contradiction.

To fulfil the object as addressed above and under the first aspect of the present invention a vacuum treatment apparatus comprises
  A vacuum chamber with a reaction space and in the chamber:
  A plasma discharge arrangement which comprises an electron source cathode, an anode arrangement and a substrate carrier, whereby the electron source cathode and an anode electrode of the anode arrangement are operationally inter-connected via an electric supply source;
  wherein further the anode arrangement comprises a confinement with an inner space open towards the reaction space and containing the anode electrode;
  wherein the confinement is mounted electrically isolated from the anode electrode;
  the substrate carrier is mounted within the vacuum chamber so as to position a surface area of a substrate on said carrier adjacent to the opening of the confinement and substantially closer to the opening than to the electron source cathode and further being conceived so as to operationally connect the substrate to an electric biasing source.

Further embodiments of such apparatus, which may be combined by two, three or more if not in mutual contradiction, are specified in claims 25 to 40 being part of the present disclosure.

Figure 2:
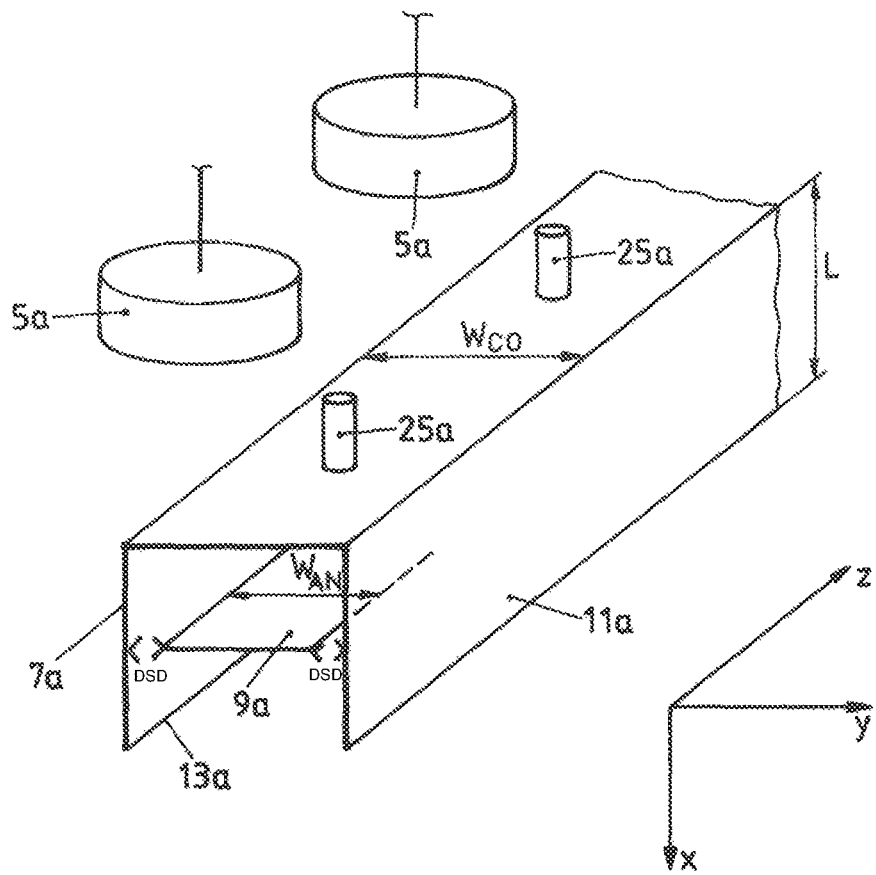
Figure 3:
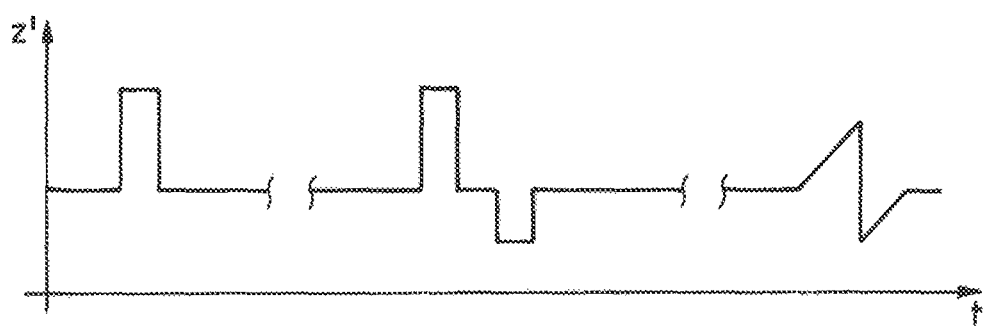
Figure 4A:
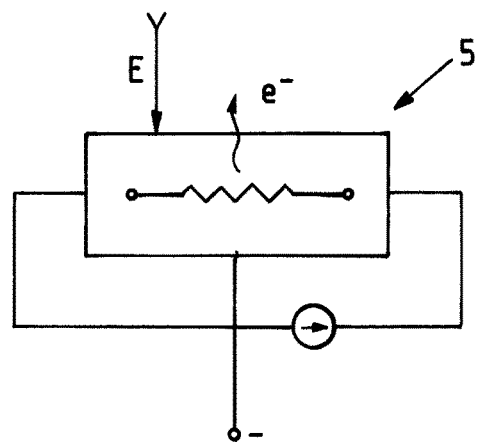
Figure 5:
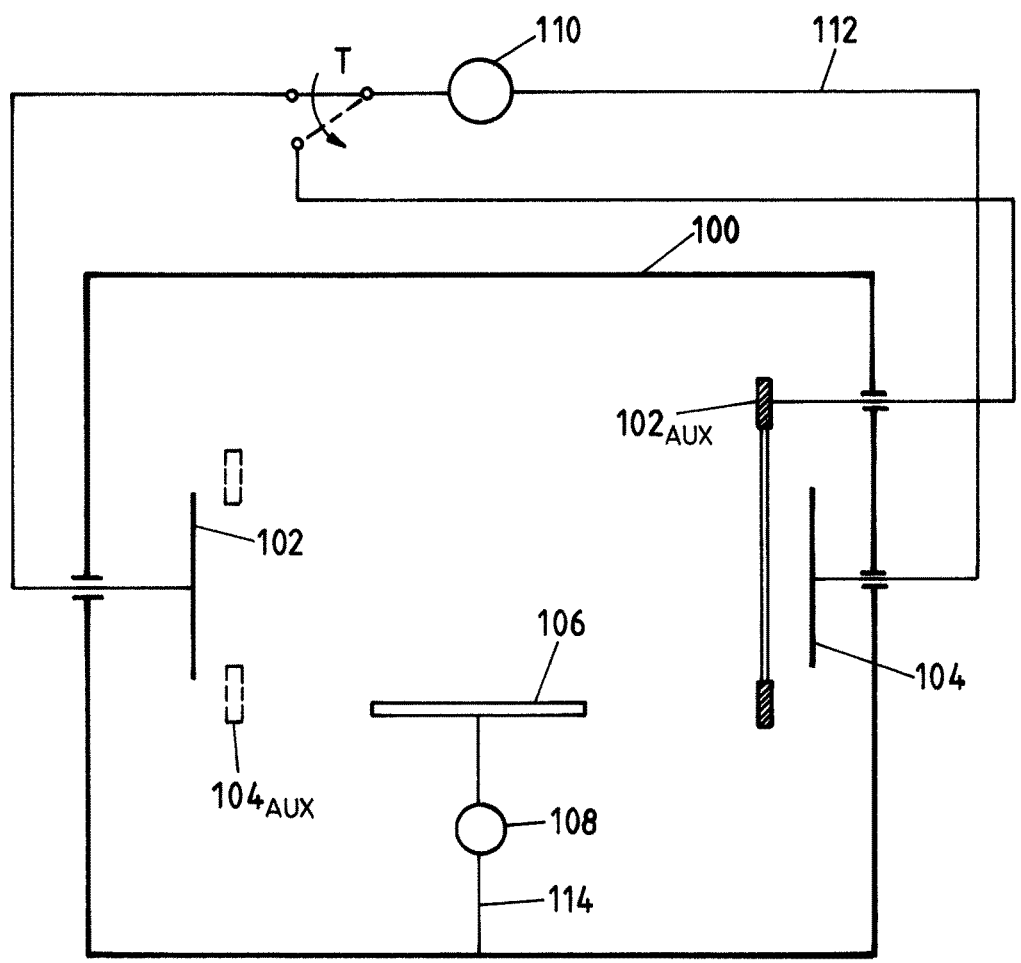
Figure 6:
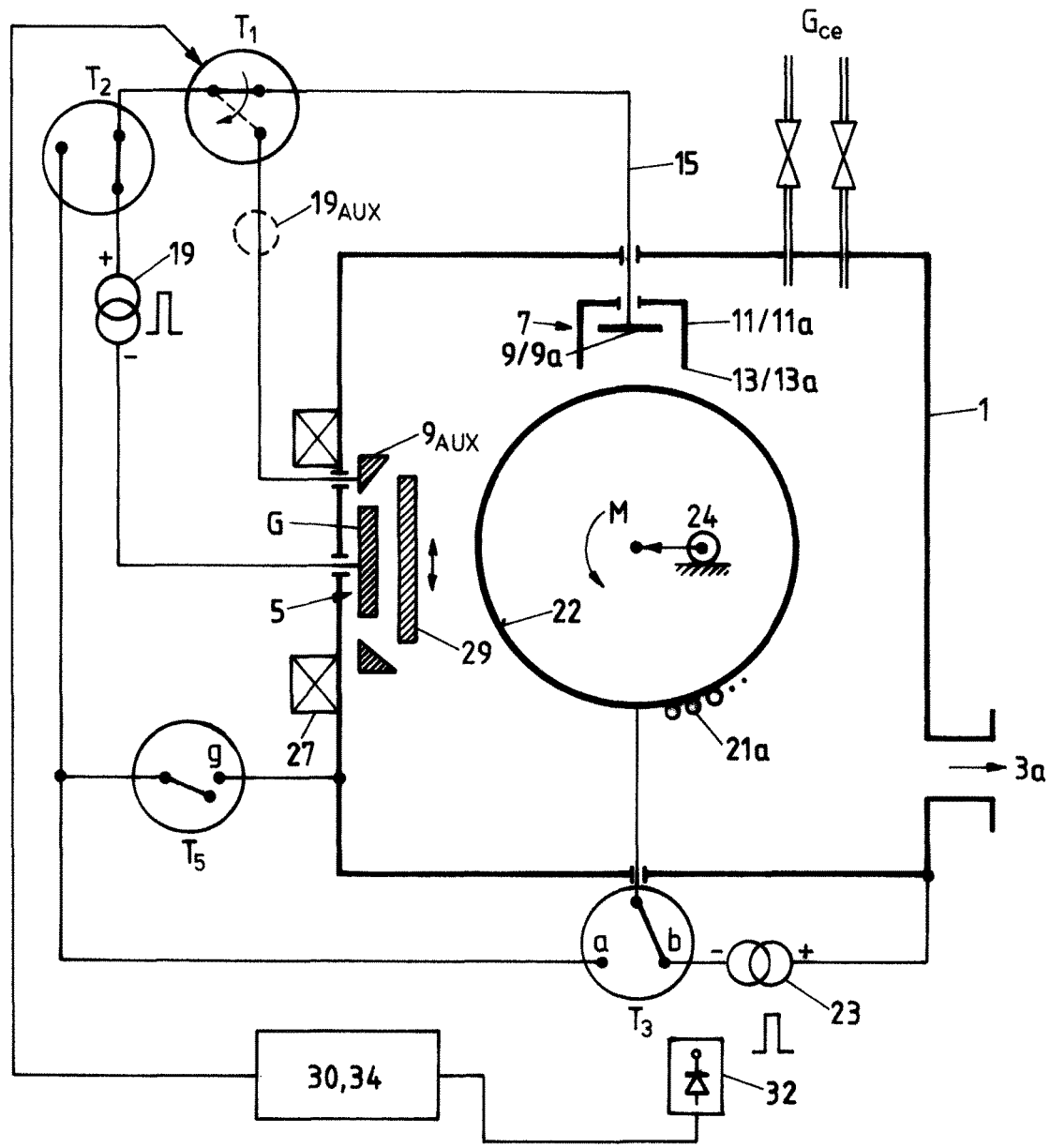
Figure 7:
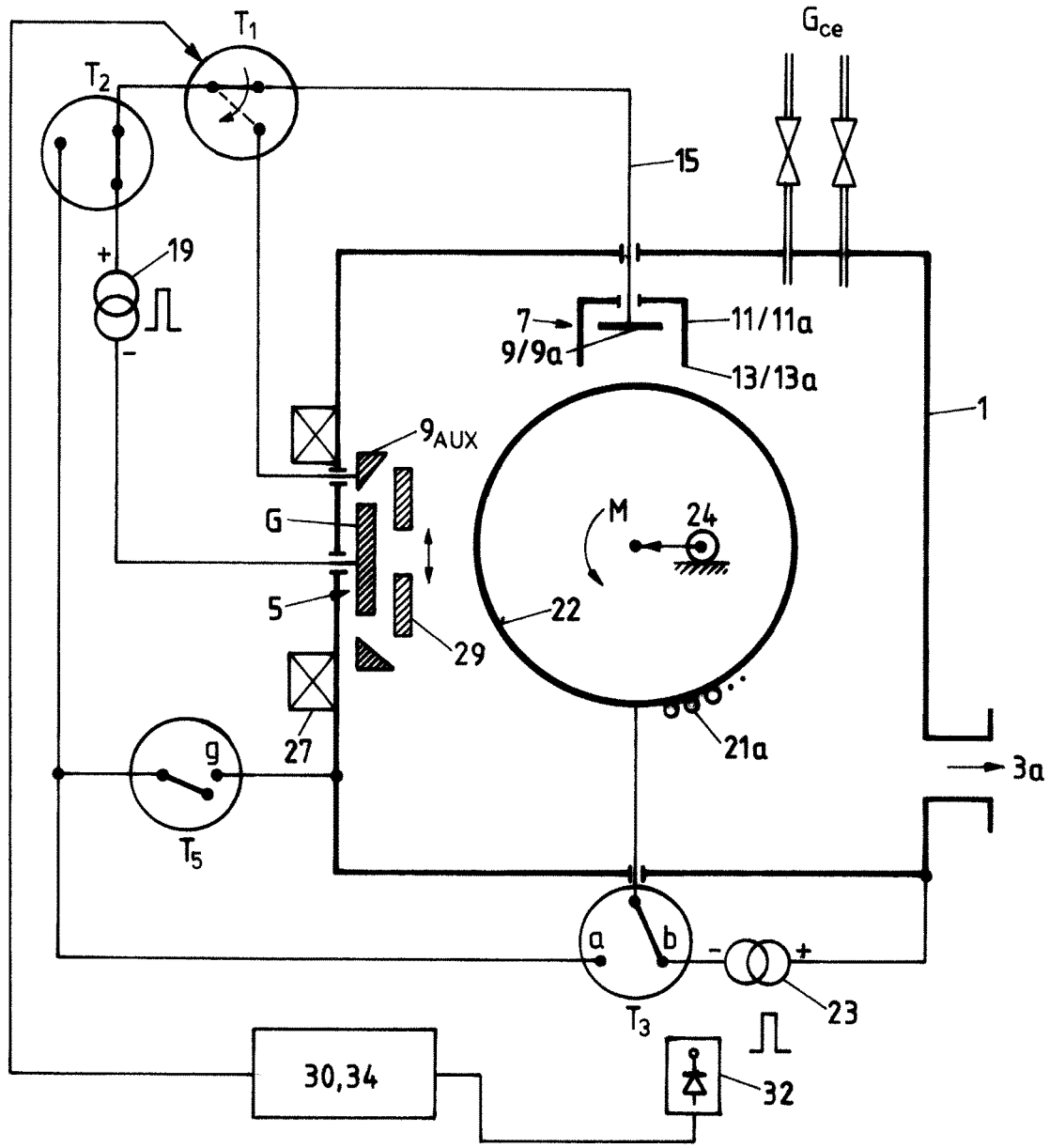
Figure 8:
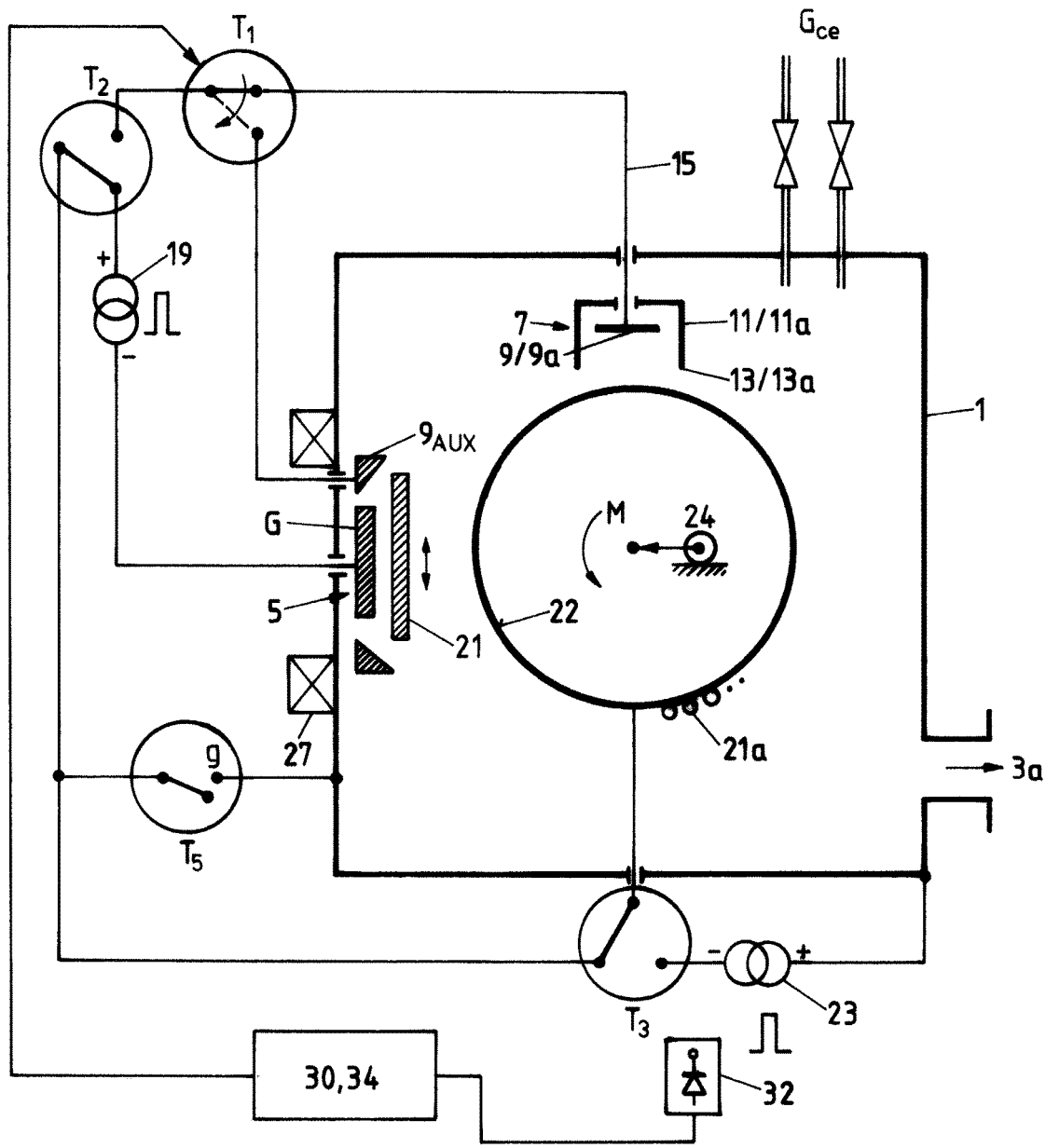
Figure 9:
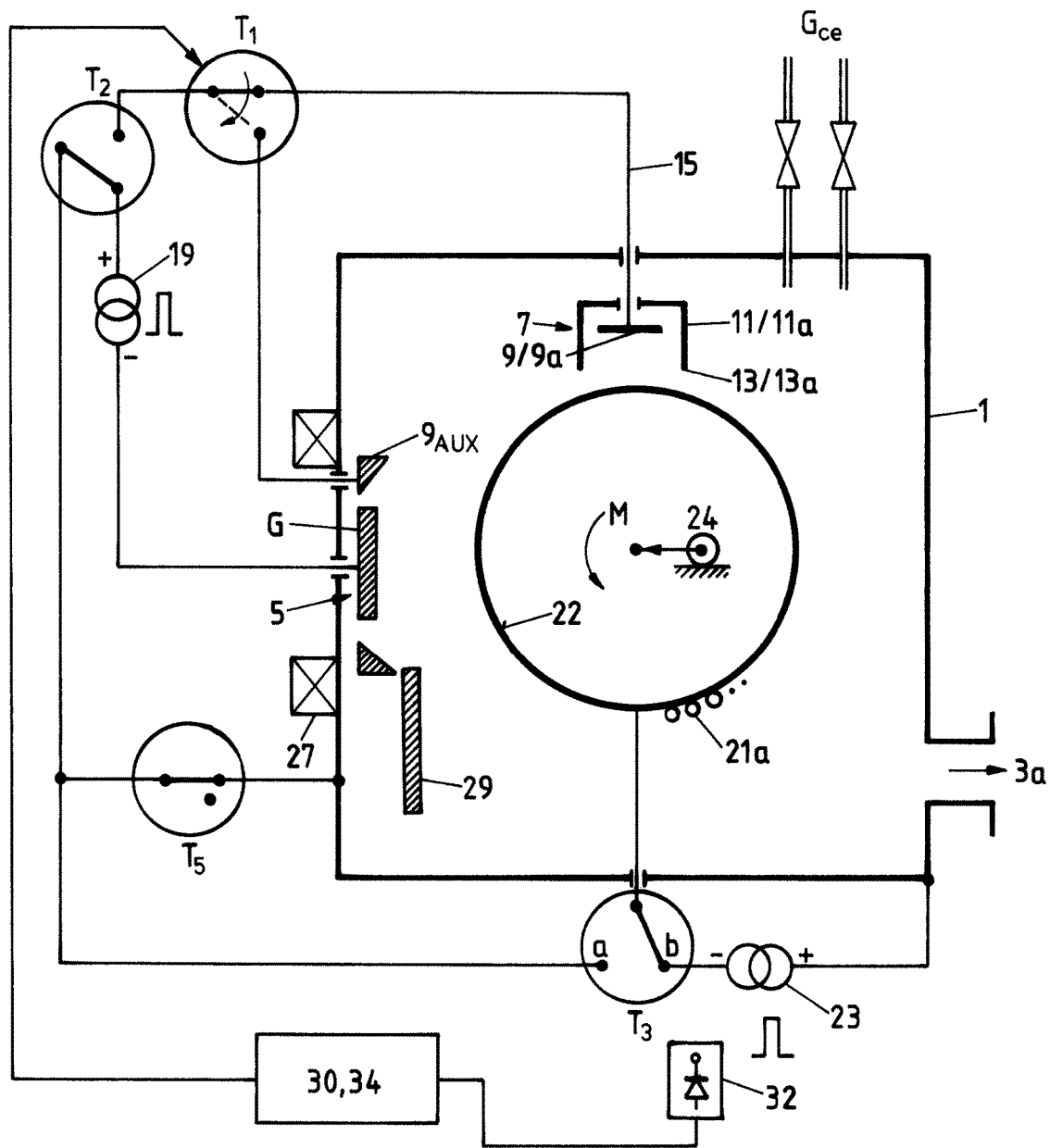

The invention shall now further be described by examples and with the help of figures. These figures show:

FIG. 1 schematically and simplified, a vacuum processing apparatus according to the present invention, operating the method for manufacturing according to the invention;

FIG. 2 in a schematic perspectivic view, an embodiment of anode arrangement as may be applied in the apparatus according to FIG. 1;

FIG. 3 heuristically, different time courses of discharge current applied to the plasma discharge electrodes in the embodiment of FIG. 1 or 2;

FIG. 4a schematically a first type of electron source cathode as applied to the apparatus according to the present invention and for operating the method according to the invention;

FIG. 4b again schematically, a second type of electron source cathode;

FIG. 5 under a second aspect of the present invention, plasma processing in a vacuum chamber and preventing processing damage by undesired arcing;

FIG. 6 still simplified and schematically, a more detailed processing apparatus according to the present invention and performing the manufacturing method as of the invention, operating in etch-cleaning mode;

FIG. 7 the apparatus and method according to FIG. 6 operated in metal ion etching mode;

FIG. 8 the apparatus and method according to the FIG. 6 or 7 operated in substrate heating mode, and FIG. 9 the apparatus and methods as of FIG. 6 to 8 operated in substrate coating mode.

FIG. 1 shows the principal of the method for manufacturing a clean substrate according to the present invention and performed by a vacuum cleaning apparatus as of the present invention. In a vacuum chamber 1 evacuated by a pumping arrangement 3 there is provided an electron source cathode 5 and an anode arrangement 7. The electron source cathode 5 emits electrons into the reaction space R of the vacuum chamber 1. The anode arrangement 7 comprises an anode electrode 9 and a confinement 11. The confinement 11 defines for an inner space having an opening 13 towards the reaction space R. The anode electrode 9 is provided within the inner space of the confinement 11 and is electrically isolated from the confinement 11. The confinement 11 is made of metal and/or of dielectric material, whereby in one embodiment at least the inner surface of the confinement 11 is of metal. The confinement 11 is operated on a floating electric potential $\Phi_{fl}$. For some applications the confinement might be operated on a predetermined or adjustable electric potential as with respect to the wall of the vacuum recipient and as shown in FIG. 1 in dashed line representation at 17. The electron source cathode 5 and the anode electrode 9 are electrically supplied by a supply source 19, which generates a signal comprising a DC component with polarity as shown in FIG. 1.

Electrons generated by the electron source cathode 5 are propelled by the electric field from the emitting surface of the electron source cathode 5 towards the anode electrode 9. Due to the confinement 11 which is operated on an electric potential which is different from the electric potential of the anode electrode 9 in any case, there results, as schematically shown in FIG. 1, an increased density of electrons within the confinement 11 and adjacent to its opening 13.

A working gas $G_{ci}$, e.g. Argon, Krypton, Xenon or a mixture thereof is inlet into the vacuum chamber 1 and is ionised by electron impact. Whenever reactive cleaning is to be performed, additionally, a reactive gas as e.g. Nitrogen, Hydrogen, Oxygen or a mixture thereof, is inlet into the chamber 1.

Due to the increased electron density in the confinement 11 and adjacent to its opening 13 there results in the addressed area an increased ionization rate of the working gas and, in the case of reactive etch-cleaning, an increased activation of the reactive gas. A substrate 21, the surface area S thereof having to be cleaned, is positioned on a substrate carrier 22 adjacent to the opening 13 of the confinement 11 with the surface S pointing towards the opening 13 and thus being exposed to the plasma of increased density in that area. One can say that by means of a confinement 11 an increased plasma density is "focussed" towards the surface area S, resulting in an increased etching rate, be it reactively or non-reactively. The substrate 21 is thereby operated via substrate carrier 22 on an electric potential which is negative with respect to the plasma potential. This is achieved, as schematically shown in FIG. 1, by operating the carrier 22 on a negative potential with respect to the electric potential of the vacuum chamber wall by means of a supply source 23.

The inner surfaces of confinement 11 as well as of a protection tube 25 for supply connection 15, which is provided in the embodiment of FIG. 1 as a part of confinement 11, are distant from the anode electrode 9 and from the supply connection 15 by at most dark space distance DSD at the operating conditions selected and prevailing in the vacuum chamber 1. Please note that the electric feedthrough tube 25 is electrically isolated from the wall of the vacuum chamber and is on the electric potential of the confinement 11.

The inner space of confinement 11 is shaped in a cross-sectional plane according to the x/y plane as a U, whereby the anode electrode 9 resides adjacent to the bottom of the U, as addressed above, spaced from the bottom and from the legs of the U by at most dark space distance DSD.

In spite of the fact that the electrode arrangement 7 may be configured to have a substantially circular of square opening, in one embodiment as shown in FIG. 2, the anode arrangement is conceived extended in the direction z transverse to the x/y plane of FIG. 1 e.g. linearly. Thereby the electrode anode 9a extends linearly as well and so does the U profile confinement $11_a$. The anode electrode 9a in the embodiment according to FIG. 2 is electrically supplied through protecting tubes 25a.

In one configuration more than one electron source cathodes are provided as schematically shown in FIG. 2 at 5a. So as to achieve a significant increase of electron density and thus of plasma density in the confinement 11, 11a and adjacent the respective opening 13, 13a, a discharge current density per unit of anode electrode surface is to be selected of at least 0.5 A/cm². Thereby, there results across the anode dark space an anode fall of electric potential of approx. 50 V to 100 V, which leads to high electron acceleration towards the anode electrode with respective ionizing effect or, upon reactive gases, activating effect.

At least an indicia, that such an anode fall of electric potential is present is an anode electrode to chamber wall potential difference of about 10 V to 85 V.

Nevertheless, by such electron bombardment the anode electrode is heavily thermically loaded, which necessitates specific measures. In fact it is the thermical loading of the anode electrode 9, 9a and the efficiency of counter measures, which are decisive for the upper limit of the discharge current density applicable. In spite of the fact that it is clearly feasible to provide, within the anode electrode 9, 9a a system of channels and to feed a heat transport medium through such channels to remove excess heat from the anode electrode, this approach is coupled with substantial constructional complexity and costs.

So as to achieve the high plasma densities coupled to the addressed high discharge current densities and respective high etching rates on the substrate without active anode electrode cooling, the supply source 19 is operated with a DC bias current and superimposed pulses. The plasma discharge between the electron source cathode 5, 5a and the anode electrode 9, 9a which is in fact a low voltage discharge is thus operated as shown in FIG. 3 with pulsating current superimposed on a DC bias current. As schematically shown in FIG. 3 the superimposed pulses may be of one polarity with respect to the DC bias value, may be of both polarities and in either case may be of selected shape and thus spectrum. In one embodiment at least one of pulse repetition frequency, mono or bi-polar pulse amplitude with respect to the DC bias value, duty cycle and thus pulse width and shape of the superimposed pulses may be selected or adjusted. Thereby, the plasma density adjacent to the anode arrangement, in and adjacent the confinement 11, 11a, may be adjusted.

In a further embodiment and as shown in FIG. 1 the low-voltage plasma discharge between the electron source cathode 5 and the anode electrode 9 is controllably shaped with the help of a magnetic field H, which is generated as schematically shown by a coil arrangement 27. By means of such magnetic field realized to be controllably variable it becomes possible to control the plasma impedance between the electron source cathode 5 and the anode 9 and thereby to control the resulting plasma density to which the substrate area S is exposed. By means of such magnetic field H it becomes thereby possible to adjust and vary the etching rate distribution along the surface area S of the substrate 21 being etch-cleaned.

Up to now we have discussed the electron source cathode 5 as just providing electrons. Nevertheless, two types of electron source cathodes 5 may be utilized. A first type does in fact substantially exclusively emit electrons as e.g. a hot filament cathode or a hollow cathode electron source. FIG. 4a shows by means of a schematic representation this first type of electron source represented by a hot filament source heated by heating current I. E denotes the electric field as applied by the low voltage between the electron source cathode 5 and the anode electrode 9, 9a.

Figure 4B:
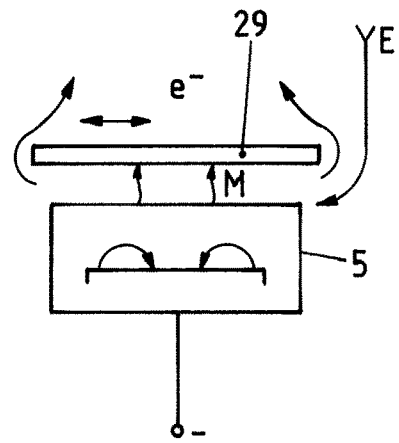

The second type of electron source cathode 5 is the one by which additionally to electrons source material is emitted into the reaction space. Such sources are e.g. sputter sources including magnetron sputter sources, arc evaporation sources. This type of electron source cathode is schematically represented in FIG. 4b by a magnetron sputter source. If the substrate to be inventively manufactured is just to be etch-cleaned, then electron source cathodes of the first type may be used. If, on the other hand, a substrate is to be further processed, once before and/or after cleaning, i.e. coated with a layer system, then it is advantageous to make use of electron source cathodes 5 of the second type.

As shown in FIG. 4b when using such second type electron source cathode 5, there may be provided a controllably movable shutter 29 which is movable between a closed position as shown, obstructing material flow from the cathode surface towards and onto the substrate 21 and an open position where such flow is enabled. In the gas ion etch-cleaning operation mode the shutter 29 is in closed position. For etch-cleaning as was addressed to now, the only anode which cooperates with the electron source cathode 5, irrespective of its type, is the anode electrode 9, 9a. By the addressed etching technique and especially due to the concept of the anode arrangement 7 operated as was described, there is reached a very high etching rate on the substrate. Thereby, the high density plasma is "focussed" on the substrate surface area. Tailoring the anode arrangement extending linearly as was shown in FIG. 2 and possibly moving the substrates relative to the anode arrangement leads to a very good etching rate density distribution along the surface of the etch-cleaned substrate. The etching effect is homogeneously distributed along the substrate surface and also within intrusions and along protrusions of such surface: If thereby the substrate is a tool body with cutting edges there results that such edges are etched equally to areas aside the edges.

Still with an eye on FIG. 1 it has to be noted that for additionally adjusting the etching rate on the substrate area S as well as its thermal loading by electron- and ion-bombardment, the biasing source 23 is operated either with DC or with DC and AC which encloses operation with DC and superimposed mono- or bipolar pulses. Whenever biasing is performed with DC and superimposed pulses at least one of pulse repetition frequency, pulse width and thus duty cycle, mono- or bipolar pulse amplitude and pulse shape may be adjusted to optimize the specific sputter cleaning effect on the substrate area S.

It has been addressed that the plasma discharge between the electron source cathode 5 and the anode electrode 9, 9a may be said a "low voltage" plasma discharge. Although this term is perfectly understood by skilled artisans, it is not clearly defined as to what is meant by "low". This is clarified by some of the operating parameters as of discharge voltage and discharge current resulting from discharge current density and anode electrode surface, as listed below.

In the following operating parameters which are today recommended are listed:

Surface of anode electrode exposed to reaction space and as used today:

| | |
|---|---|
| Width $w_{AN}$ as shown in FIG. 2 in y direction: | 8 cm |
| Extent in z direction of FIG. 2: | 60 cm |

$W_{AN}$ more generically results from the extent of the substrate in z direction and an overlength of the anode electrode on both substrate ends of 5 cm to 10 cm.

| | |
|---|---|
| Electron source cathodes 5a: | 2 arc evaporator targets |
| Discharge current between each of the targets and the anode electrode: | 200 A |
| resulting in a current density at the exposed surface of anode electrode 9a of | 0.83 A/cm$^2$ |
| Confinement: | |
| Extent $w_{CO}$ of the bottom of the U: | 8 cm + 2 × DSP |
| Length L of the legs of the U: operated on floating electric potential. | 0.5 $w_{AN}$ to 1.5 $w_{AN}$ |
| Distance d between confinement opening 13 and substrate area S (see FIG. 1): | 2 cm ≤ d ≤ 10 cm, preferred 4 cm ≤ d ≤ 6 cm. |

By varying the length L of the legs of the confinement U the etching rate distribution may be adjusted.

Etching gases:
  working gas: Argon, Krypton, Xenon or a mixture thereof.
  Reactive etching gas: Nitrogen, Hydrogen, Oxygen or a mixture thereof.
Total operating pressure: 0.1 Pa to 10 Pa, preferred 0.1 to 3 Pa (all limits included).
Discharge low voltage $U_{AC}$ between electron source cathode and anode electrode:
  20 V≤$U_{AC}$≤100 V, preferred
  35 V≤$U_{AC}$≤70 V
which results in a potential difference between the anode electrode and the vacuum chamber wall of between 10 and 85 V, thereby, in preferred operation, of between 20 and 50 V.
pulse repetition frequency f: 0.2 Hz≤f≤200 KHz
Magnetic field H installed to control the etching distribution along the substrate, and/or to control the plasma impedance and thereby e.g. processing rate at given discharge voltage $U_{AC}$.

Biasing of the substrate: DC of 10 V to 2000 V, more specifically:
  for etch cleaning 60 V to 1000 V,
  for metal ion etching 600 V to 2000 V,
  for coating 10 V to 300 V,
thereby superimposing pulses with a repetition frequency of 0 Hz to 500 KHz, thereby preferred in the frequency range of 50 KHz to 300 KHz.

Up to now we have described under the first aspect of the present invention manufacturing cleaned substrates and an apparatus to perform such processing.

By means of FIG. 5 a second aspect of the present invention shall be described which is per se considered inventive, but which may optimally be combined with cleaned substrate manufacturing as was described to now under the first aspect.

In FIG. 5 this second aspect is shown in a most generalized form. Within a vacuum chamber 100 a pair of plasma discharge electrodes 102 and 104 is operated by a electric supply source 110 to generate a plasma discharge. Under general considerations one of the electrodes 102, 104 may e.g. be a sputtering cathode, an arc evaporation cathode, a hollow cathode, a hot filament cathode, etc. Still under the general considerations the expression "cathode" and "anode" may be rather undefined or only defined by respective etching to sputtering ratio at the respective electrode surfaces, if the electrode pair is AC and thereby especially RF supplied. Accordingly one or even both of the electrodes may be formed by at least parts of the vacuum chamber wall as perfectly known to the skilled artisan e.g. with an eye on RF etching chambers.

A substrate 106 to be treated is provided and in the vacuum chamber 100 biased by a biasing source. The substrate may nevertheless and under a general aspect be deposited on one of the electrodes 102 and 104 as also perfectly known to the skilled artisan.

In such general processing undesired arcing shall be considered which may occur between the electrodes 102 and 104 as e.g. between anode and target of a sputtering source or between either of the electrodes 102 and 104 and substrate 106. Clearly when the electrodes 102 and 104 concomitantly define for an arc evaporating source then arcing between these electrodes is desired arcing, but not arcing between either of the electrodes and the substrate 106.

Under the second aspect of the present invention process damages by undesired arcing are to be prevented. This is achieved by switching that electrode 102 or 104 which is involved in undesired arcing to a respective auxiliary electrode. Thus, according to FIG. 5 there is provided e.g. an auxiliary electrode $102_{AUX}$. By means of a switching unit T the discharge supply source 110 is switched from electrode 102 to auxiliary electrode $102_{AUX}$. This is performed either regularly, e.g. periodically during plasma treating of the substrate 106 to prevent the addressed arcing or arcing is detected as it starts and then the supply source 110 is switched. In any case operation of the processing electrode, as of electrode 102, by operation of the respective auxiliary electrode, as of electrode $102_{AUX}$ is done for a short first time span significantly shorter than processing second time spans before and after the first time spans. Arcing between the electrodes 102 and 104 may be detected as known to the skilled artisan e.g. by monitoring the discharge current in the supply loop 112.

Thereby, it will be a matter design and specific application which of the electrodes shall be switched on an auxiliary electrode. E.g. in the case of the two electrodes 102 and 104 being realized by a sputter target and an anode of the respective sputtering source there will be provided an auxiliary cathode rather than an auxiliary anode. If with an eye on FIG. 5 the disturbing arcing occurs between one of the two electrodes 102 and 104 on one hand and substrate 106 on the other hand, this may be detected by monitoring the biasing circuit current 114, which of the electrodes 102, 104 is involved which arcing on the substrate may thereby be detected by analyzing current burst polarity. In this case the respectively involved electrode 102 or 104 is switched to its auxiliary partner.

Departing from the generic concept of the present invention under its second aspect and has been explained with the help of FIG. 5 we switch back on FIG. 1 which up to now was explained only in context with the invention's first aspect, which is etch cleaning.

It is perfectly clear that the prevention of processing damages due to undesired arcing as was generically explained in context with FIG. 5 may and is perfectly suited to be applied in the embodiment as has been explained in context with FIG. 1.

Consequently and according to FIG. 1 there is provided adjacent to the electron source cathode 5 an auxiliary anode $9_{AUX}$, e.g. conceived as a ring anode. Whenever arcing is to be prevented or occurring arcing is to be disabled, anode 9 is disconnected and replaced by auxiliary anode $9_{AUX}$ by means of a switching unit T. The operation of switching unit T is either performed under timer control from a timing unit 30 or is triggered by arc detection. Arc detection is performed e.g. by monitoring the current in the substrate biasing loop as schematically shown by a detector unit 32. The output of unit 32 triggers e.g. a single- or multi-pulse generator unit 34, whereat, preferably, pulse length may be adjusted. The switching unit T is thus controlled either by the timer unit 30 or by the pulse generator unit 34 or by both as schematically shown by the and/or relation in FIG. 1. Thereby, arc prevention may e.g. be realized under the control of timer unit 30 and arc detection control may be applied as an emergency control if in spite of the control by timer unit 30, arcing occurs.

Thus, the generic arc prevention approach as has been explained in FIG. 5 is most suited to be applied in combination with the cleaning technique as has been explained in context with FIGS. 1 to 4.

In FIG. 6 there is shown a vacuum facility for treating a multitude of tool bodies as substrates. The facility as schematically shown in FIG. 6 is one embodiment realized in line with the embodiment of FIG. 1 or 2 for the addressed specific kind of substrates. It incorporates the arc handling method as was explained with the help of FIG. 5 and in FIG. 1.

For facilitating comparison from the FIG. 6 embodiment with that of FIG. 1, the same reference numbers are used for corresponding parts.

Within the vacuum chamber 1 with an evacuation port 3a there is provided an electron source cathode 5, realized by an arc evaporation target cathode 6. Instead e.g. a thermal emission cathode or a sputter target cathode may be provided, generally an electron source cathode of the second type as addressed above.

The anode arrangement 7 comprises the anode electrode 9 or 9a as well as the confinement 11 or 11a. The confinement 11, 11a is of a metal and is operated on floating electric potential.

The confinement 11, 11a defines for the opening 13, 13a respectively. Via supply connection 15 and a switching unit T1 as well as a switching unit T2 the anode electrode 9, 9a is fed by supply source 19 with respect to the arc evaporation target cathode 6. Substrates 21a are supported on a substrate carrier carousel 22 drivingly rotatable about an axis M by a motor drive 24. On carousel 22 the substrates 21a, cutting tool bodies, are operated on a defined electric potential via switching unit T3 and by biasing supply unit 23.

The magnetic field H is generated by means of the coil arrangement 27. The sputtering target cathode 6 is shielded from the substrates 21a on carousel 22 by means of the controllably movable shutter 29 (see FIG. 4b). Adjacent to the arc evaporation target cathode 6 there is provided the auxiliary anode $9_{AUX}$. With respect to geometric dimensions and operating parameters the same is valid as was addressed in context with the FIG. 1 embodiment. The embodiment of FIG. 6 may be operated in different operating modes, which will be explained subsequently. The operating mode as represented in FIG. 6 is the etch-cleaning mode, whereby a working gas and possibly a reactive gas is inlet to the vacuum chamber 1 via respective gas inlets $G_{Cl}$. In the etch-cleaning mode the anode electrode 9, 9a is operationally connected via switching unit T1 and switching T2 to the positive pole of supply source 19, the negative pole thereof being operationally connected to the arc evaporation target cathode 6. The substrate carrier carousel 22 and therewith the substrates 21a are operationally connected to the negative pole of biasing source 23 via switching unit T3, the positive pole thereof being connected to the wall of the vacuum recipient 1. The operationally movable shutter 21, which is controllably driven by a respective drive (not shown), is closed and barring source material sputtered off the sputtering target cathode 6 from reaching the substrates 21a on rotating carousel 22.

In this operating mode, in which a low voltage plasma discharge is operated between arc evaporation target cathode 6, acting as an electron source, and anode electrode 9, 9a, the substrates 21a on rotating carousel 22 are etched by working gas ions or possibly by activated reactive gas as was described in context with FIG. 1. Arc detection or more generically arc damage protection is performed as was explained in context with FIG. 1 by the unit 30, 34, the detector unit 32, thereby operating switching unit T1 subsequently in time as e.g. periodically and/or whenever sensor unit 32 detects arcing about to occur. By this controlled operation the switching unit T1, in analogy to switching unit T of FIG. 1, enables operation of auxiliary anode $9_{AUX}$ relative to the arc evaporation target cathode 6 instead of operation of anode electrode 9, 9a.

FIG. 7 shows the embodiment as was described in context with FIG. 6 operated in a second operating mode, in the metal ion etching or cleaning mode.

Thereby, the shutter 29 is partly open so that from a metallic arc evaporation target cathode 6, metal particles or ions reach the substrate surface. Thereby, etching of the substrates 21a on revolving carousel 22 is additionally performed by metal ion impact. Prevention of arcing damages is performed as was explained in context with FIG. 6.

FIG. 8 shows the embodiment of FIG. 6 operated in a third mode, the heating mode. By means of switching unit T2 operation of the anode electrode 9, 9a is disabled and the substrates 21a on revolving carousel 22 are switched via switching unit T3 and switching unit T2 on the positive pole of the supply source 19, thus as anodes with respect to the arc evaporation target cathode 6. The shutter 21 is closed. Thereby, the substrates 21a are heated by electron bombardment. The heating rate is controlled by appropriately adjusting the supply source 19. Arc damage prevention may be disabled.

In FIG. 9 there is shown the embodiment as of FIG. 6 operated in substrate coating mode. Thereby, the arc evaporation target cathode 6 is operated as a part of a normal sputtering source, whereat the wall of the vacuum recipient 1 acts as an anode. This is realized via switch unit T5 and T2. The anode electrode 9, 9a previously, i.e. in etch-cleaning or metal etch-cleaning mode, operating as the anode with respect to the arc evaporation target cathode 6, is disabled.

Whenever for damage prevention the auxiliary anode is activated it is possibly desired to operate such auxiliary anode $9_{AUX}$ on an electric potential with respect to the cathode which is different from the electric potential at which the standard anode 9, 9a is operated. As shown in FIG. 6 in dashed line this may be realized by applying an auxiliary supply $19_{AUX}$.

The invention claimed is:

1. A vacuum treatment chamber defining a reaction space and comprising:
    a plasma discharge arrangement comprising an electron source cathode, an anode arrangement and a substrate carrier, said electron source cathode and an anode electrode of said anode arrangement being operationally interconnectable via an electric supply source;
    said anode electrode having a shape of a two-dimensionally extended plate with a surface area facing said reaction space;
    a confinement with an inner space and an opening open towards said reaction space and through which said surface area of said anode electrode is exposed to and faces said reaction space,
    said inner space of said confinement being U-shaped at least in one cross sectional plane through said confinement, and
    said anode electrode being mounted along a bottom of said confinement, spaced from said confinement and electrically isolated from said confinement, said surface area of said anode electrode extending closer to said bottom of said confinement than to said opening of said confinement,
    said opening of said confinement opening towards said reaction space and towards the substrate carrier,
    said electron source cathode being located outside of said confinement,
    said substrate carrier being mounted within said vacuum chamber and in said reaction space so as to position a surface area of a substrate on said substrate carrier facing said opening and substantially closer to said opening than to said electron source cathode,
    said substrate carrier being connectable to an electric source.

2. The vacuum treatment chamber of claim 1, wherein said inner space forms a channel transverse to said cross-sectional plane.

3. The vacuum treatment chamber of claim 1, wherein said anode electrode has in said cross-sectional plane an extent $W_{AN}$ the legs of said U-shaped inner space of said confinement having, from said bottom, an extent L for which there is valid:
    $0.5w_{AN} \le L \le 1.5w_{AN}$.

4. The vacuum treatment chamber of claim 1, wherein said substrate carrier is mounted within said vacuum chamber so as to position said surface area of said substrate at a distance d from a plane defined by said opening and wherein there is valid:
    $2 \text{ cm} \le d \le 10 \text{ cm}$.

5. The vacuum treatment chamber of claim 1, further comprising a movable shutter between said electron source cathode and said substrate carrier, said shutter being drivingly movable from a closed position covering the emitting surface of said electron source cathode to an open position remote from said surface of said cathode.

6. The vacuum treatment chamber of claim 1, wherein said electron source cathode is a sputtering or an arc evaporation target.

7. The vacuum treatment chamber of claim 1, within an etch cleaning apparatus and wherein said etch cleaning apparatus is operatable additionally in the following operating modes:
    metal ion etch cleaning mode, wherein said electron source cathode emits electrons and source metal and is only partially covered by a shutter between the emitting surface of said cathode and said substrate carrier;
    a heating mode, wherein said anode electrode is disconnected from said electric supply source and said substrate carrier is operationally connected as an anode via said electric supply source to said electron source cathode; and
    a coating mode.

8. The vacuum treatment chamber of claim 1, further comprising an auxiliary anode electrode in said vacuum chamber.

9. The vacuum treatment chamber of claim 8, wherein said auxiliary anode is located substantially nearer to said electron source cathode than to said anode arrangement.

10. The vacuum treatment chamber of claim 1, wherein the opening of the confinement opens towards the substrate and the substrate carrier, and away from the electron source cathode.

11. The vacuum treatment chamber of claim 1, wherein said anode arrangement is located between said substrate carrier and said electron source electrode.

12. The vacuum treatment chamber of claim 1, further comprising an electrical supply source interconnecting said electron source cathode and said anode electrode, wherein said electric supply source is a source generating DC output with superimposed pulses.

13. A vacuum treatment apparatus comprising:
    a vacuum treatment chamber defining a reaction space and in said vacuum treatment chamber;
    a plasma discharge arrangement comprising an electron source cathode, an anode arrangement and a substrate carrier, said electron source cathode and an anode electrode of said anode arrangement being operationally inter-connectable to an electric supply source;
    said anode electrode consisting of a shape of a two-dimensionally extended plate comprising one surface area exposed to said reaction space, said one surface area being flat and facing said reaction space,
    a confinement with an inner space and an opening open towards said reaction space and through which said one surface area of said anode electrode is exposed to and faces said reaction space,
    said inner space of said confinement being U-shaped at least in one cross sectional plane through said confinement, and
    said anode electrode being mounted along a bottom of said confinement, spaced from said confinement and electrically isolated from said confinement,
    said one surface area of said anode electrode extending closer to said bottom of said confinement than to said opening of said confinement,
    said opening of said confinement opening towards said reaction space and towards the substrate carrier,
    said electron source cathode being located outside of said confinement, said substrate carrier being mounted within said vacuum chamber so as to position a surface area of a substrate on said substrate carrier adjacent said opening and substantially closer to said opening than to said electron source cathode, said substrate carrier being operationally connected to an electric source.

14. The vacuum treatment apparatus of claim 13, wherein said anode electrode, said electron source cathode and a circuit containing said electric supply source and operationally interconnecting said anode electrode and said electron source cathode are electrically floating.

15. The vacuum treatment apparatus of claim 13, wherein said confinement is connected to an electrical confinement biasing source.

16. The vacuum treatment apparatus of claim 13, further comprising an electrical supply source inter-connecting said electron source cathode and said anode electrode, wherein said electric supply source is a source generating DC output with superimposed pulses.

17. The vacuum treatment apparatus of claim 13, comprising an auxiliary anode electrode in said vacuum chamber and a switching unit enabling operation of said auxiliary anode instead of said anode electrode.

18. The vacuum treatment apparatus of claim 17, wherein said switching unit has a control input which is operationally connected to at least one of an output of a timer and of an output of an arc detector unit.

* * * * *